US006493788B1

(12) United States Patent
Sun et al.

(10) Patent No.: US 6,493,788 B1
(45) Date of Patent: *Dec. 10, 2002

(54) PROCESSOR WITH EMBEDDED IN-CIRCUIT PROGRAMMING STRUCTURES

(75) Inventors: Albert C. Sun, Taipei (TW); Chang-Lun Chen, Hsinchu (TW); Chee-Horng Lee, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/525,835

(22) Filed: Mar. 15, 2000

Related U.S. Application Data

(63) Continuation of application No. 08/952,045, filed as application No. PCT/US96/17302 on Oct. 28, 1996, now Pat. No. 6,151,657.

(51) Int. Cl.[7] ............................................... G06F 12/02
(52) U.S. Cl. ......................................... 711/103; 717/11
(58) Field of Search ............................. 711/103; 717/11

(56) References Cited

U.S. PATENT DOCUMENTS

| | | | |
|---|---|---|---|
| 4,491,914 A | 1/1985 | Sujaku | 714/38 |
| 4,794,558 A | 12/1988 | Thompson | 712/37 |
| 4,805,109 A | 2/1989 | Kroll et al. | 705/405 |
| 5,018,096 A | 5/1991 | Aoyama | 711/164 |
| 5,163,147 A | 11/1992 | Orita | 707/9 |
| 5,233,613 A | 8/1993 | Allen et al. | 714/55 |
| 5,247,659 A | 9/1993 | Curran et al. | 713/1 |
| 5,276,839 A | 1/1994 | Robb et al. | 711/103 |
| 5,278,976 A | 1/1994 | Wu | 714/55 |
| 5,388,267 A | 2/1995 | Chan et al. | 713/2 |
| 5,404,494 A | 4/1995 | Garney | 709/300 |
| 5,432,927 A | 7/1995 | Grote et al. | 713/2 |
| 5,444,664 A | 8/1995 | Kuroda | 365/226 |
| 5,444,861 A | 8/1995 | Adamec et al. | 717/11 |
| 5,467,286 A | 11/1995 | Pyle et al. | 702/62 |
| 5,473,758 A | 12/1995 | Allen et al. | 711/103 |
| 5,495,593 A | 2/1996 | Elmer et al. | 711/103 |

(List continued on next page.)

OTHER PUBLICATIONS

Excerpts from 3048 Hardware Manual, dated 1995 consisting of pp. 577–582.
Hitachi Single–Chip Microcomputer H8/3048 Series Hardware Manual, Jan. 1995, pp. 1, 423–424, 535, 552–553, 565–566, 571 and 604.
"MC68HC11 EEPROM Programming from a Personal Computer" AN1010, 1988 Motorola, pp.1–12.

*Primary Examiner*—Reginald G. Bragdon
(74) *Attorney, Agent, or Firm*—Mark A. Haynes; Haynes Beffel & Wolfeld LLP

(57) ABSTRACT

An architecture for an integrated circuit with in-circuit programming, allows for dynamically altering the in-circuit programming instruction set itself; as well as other software stored on the chip. The architecture is based on a microcontroller on an integrated circuit having two or more banks of embedded non-volatile memory arrays which store instructions, including an in-circuit programming instruction set. Using a control program stored on the device, the device interactively establishes an in-circuit programming exchange with a remote partner, and updates data and software, including the in-circuit programming instruction set, when needed. The processor and ICP code are responsive to an in-circuit programming update command to write a copy of the in-circuit programming set from a first memory array to a second memory array, and to cause the in-circuit programming to execute the in-circuit programming set from the second memory array to program the non-volatile memory cells of the first memory array with data from the external port.

6 Claims, 6 Drawing Sheets

U.S. PATENT DOCUMENTS

| | | | |
|---|---|---|---|
| 5,504,903 A | 4/1996 | Chen et al. | 713/1 |
| 5,564,032 A | 10/1996 | Aota et al. | 711/103 |
| 5,574,926 A | 11/1996 | Miyazawa et al. | 712/38 |
| 5,579,479 A | 11/1996 | Plum | 712/202 |
| 5,581,723 A | 12/1996 | Hasbun et al. | 711/103 |
| 5,603,056 A | 2/1997 | Totani | 710/8 |
| 5,687,345 A | 11/1997 | Matsubara et al. | 711/103 |
| 5,844,843 A | 12/1998 | Matsubara et al. | 365/185.24 |
| 5,901,330 A | 5/1999 | Sun et al. | 710/8 |
| 6,073,207 A | 6/2000 | Ideta | 711/103 |
| 6,166,953 A | 12/2000 | Matsubara et al. | 365/185.11 |
| 6,181,598 B1 | 1/2001 | Matsubara et al. | 365/185.11 |

PROCESSOR WITH EMBEDDED IN-CIRCUIT PROGRAMMING STRUCTURES

This application is a continuation of U.S. patent application Ser. No. 08/952,045, filed Oct. 3, 1997, now U.S. Pat. No. 6,151,657 which is a 371 of PCT/US96/17302 filed Oct. 28, 1996.

BACKGROUND OF THE INVENTION

1. Field of the Invention

The present invention relates to integrated circuits having a non-volatile memory for storing sequences of instructions for execution by a processor on the integrated circuit; and more to particularly to techniques for accomplishing in-circuit programming to update and modify the stored sequences of instructions.

2. Description of Related Art

Integrated circuit microcontrollers have been developed which include arrays of non-volatile memory on the chip for storing sequences of instructions to be executed by the microcontroller. The sequences of instructions can be stored in read only memory (ROM) which must be programmed during manufacturing of the device, and cannot be updated. In an alternative approach, the instructions can be stored in an EPROM array. These types of devices require a special programming device to be used to program the EPROM array before the device is placed in the circuit. In yet other systems, EEPROM memory can be sued for storing the instructions. EEPROM can be programmed much more quickly than EPROM, and can be modified on the fly. Also, flash memory can be utilized, which allows for higher density and higher speed reprogramming of the non-volatile memory storing instructions. When the non-volatile memory is reprogrammable, such as EEPROM or flash memory, and it is combined with a microcontroller, the reprogramming of the device can be accomplished while the device is in the circuit, allowing in circuit programming based on interactive algorithms.

For example, in the Internet environment, the ability to interactively download instruction sets and data to a remote device can be very valuable. For example, a company can provide service to customers without requiring the customer to bring the product back to a service center. Rather, the company can execute diagnostic functions using the in-circuit programming capability of the customer's device, across a communication channel, such as the Internet or telephone lines. Software fixes can be downloaded to the customer, and the product can be reenabled with corrected or updated code.

Example prior devices which include this capability include the AT89S8252 microcontroller, manufactured by Atmel of San Jose, Calif., and the P83CE558 single chip microcontroller, manufactured by Phillips Semiconductors of Eindhoven, The Netherlands. According to the architecture of the Philips P83CE558 microcontroller, mask ROM is utilized for the in-circuit programming ICP set of instructions, which are used for updating flash memory on the chip. Thus, the Philips microcontroller requires a dedicated mask ROM module to store fixed ICP code for each individual environment. In order to adapt the ICP code for a particular environment, the environment must be known before manufacturing is complete of the device so the mask ROM can be coded. Furthermore, the ICP communications channel is fixed to a serial RS232 port in the Philips microcontroller. The limitation to a serial port limits the application of the microcontroller to relatively narrow range of potential applications, and makes it difficult to utilize the ICP function in a dynamic communication environment where the serial port may not match well with the communication channel on which the updated software is provided.

According to the architecture of the Atmel AT89S8252 microcontroller, a dedicated Serial Peripheral Interface (SPI) port on the chip is used for the updating of flash memory storing dynamically alterable instructions. Program logic is associated with the SPI port, and therefore is inflexible. Furthermore, modification of the in-circuit programming technique cannot be done because of the hardware dedication to the SPI port. Further disadvantages of the Atmel chip include that complicated hardware used for handshaking with the ICP initiator and emulating the erase/program/verify waveform for the flash memory must be added to the chip; that the SPI bus limitation is not always the best choice in diverse system applications, and that extra system logic is required to modify original reset circuits, which are implicated by the in-circuit programming algorithm. Further, complex SPI driver and receiver logic is required outside the chip in the system using the Atmel microcontroller.

Accordingly in-circuit programming structures have been developed which rely on flash memory or other dynamically alterable non-volatile memory. However, prior art approaches have been inflexible in the in-circuit algorithms used. Thus, in dynamic networking environments where communication requirements can change, and applications of devices using the in-circuit programming can proliferate through a wide variety of circumstances, it's desirable to provide more flexible in-circuit programming capability. Furthermore, the in-circuit programming capability must insure that no instructions are lost during the in-circuit programming process, even if the power is turned off during the process. The technique must allow for interactive communication with a remote partner to accomplish the in-circuit programming process. These techniques must be available over a wide variety of media, including the Intel/Microsoft/Digital standard Universal Serial Bus (USB), the Philips Electronics/Computer Access Technology standard Access Bus, the Apple Computer/IBM/AT&T standard Geoport, the Apple Computer/Texas Instruments/NCR standard 1349 Fire Wire, the Internet, a serial port (such as RS232), and other environments.

Thus, it is desirable to provide more flexible in-circuit programming structures for use with integrated circuits.

SUMMARY OF THE INVENTION

The present invention provides an architecture for an integrated circuit supporting in-circuit programming, which allows for dynamically altering the in-circuit programming instruction set itself, as well as other software stored on the chip. This greatly expands the usability of in-circuit programming devices to a wide variety of communication environments, supporting serial ports, parallel ports, telephone communications, Internet communications, and other communication protocols as suits the needs of a particular system. The invention is based on a microcontroller or other instruction executing processor on an integrated circuit having an embedded non-volatile memory array which stores instructions, including an in-circuit programming instruction set. Using a control program stored on the device, the device interactively establishes an in-circuit programming exchange with a remote partner, and updated data and software, including the in-circuit programming sequence, when needed. For example, a self-updating algorithm, according to the present invention, proceeds as follows:

1. The device receives an in-circuit programming request.
2. The initiator is identified.
3. The device returns an identifier back to the initiator of the request.
4. The information exchange proceeds when the parties have been successfully identified.
5. In order to begin the in-circuit programming, execution of the program jumps to an in-circuit programming routine in the non-volatile memory on the chip.
6. The in-circuit programming routine mirrors itself or at least an ICP kernel, to another bank of memory on the chip.
7. The in-circuit programming software disables itself and wakes up using the mirrored ICP sequence.
8. The mirrored ICP sequence downloads new in-circuit programming software to the original ICP location.
9. The mirrored ICP sequence disables itself, and wakes up with the new ICP software in the original flash array.
10. Normal program execution is then resumed.

New instructions and data for other parts of software stored in the flash memory device can be executed at numerous places in the sequences, relying on the original ICP code, the mirrored ICP code, or the new ICP code after it has been activated.

Accordingly, the present invention can be characterized as an apparatus for in=circuit programming of an integrated circuit having a processor which executes a program of instructions. The apparatus comprises a first memory array, comprising non-volatile memory cells, on the integrated circuit which stores instructions for execution by the processor, including in-circuit programming set of instructions. A second memory array also comprising non-volatile memory cells in preferred systems, is provided on the integrated circuit. One or more external ports is provided on the integrated circuit by which data is received from an external source. Control logic, including the processor and a kernel in the ICP code, is responsive to an in-circuit programming update command to write a copy of the in-circuit programming set from the first memory array to the second memory array, and to cause the processor to execute the in-circuit programming set from the second memory array to program the non-volatile memory cells of the first memory array with data from the external port.

According to one aspect of the invention, the first memory array comprises a plurality of separately erasable blocks of non-volatile memory cells and the in-circuit programming set is stored in a particular block, During execution of the in-circuit programming set, the particular block is modified to generate a new in-circuit programming set. Then the control logic causes the processor to execute the new in-circuit programming set from the first memory array.

According to yet another aspect of the invention, the integrated circuit includes a plurality of ports to external data sources, such as one or more serial ports, one or more parallel ports, and potentially one or more specialized communication ports. The port in the plurality of ports, as used for the external port during execution of the in-circuit programming set, is determined by the instructions in the in-circuit programming set itself, and thus, can be dynamically altered in one preferred embodiment of the present invention.

According to another aspect of the invention, the integrated circuit includes a data path for programming and verifying the first memory array and optionally, the second memory array, independent of the in-circuit programming set of instructions. Thus, using multiplexed I/O pins or the like, original software can be loaded onto the device during manufacture or prior to mounting the chip into the system. In order to modify the original code, the in-circuit programming process is utilized.

The present invention can also be characterized as a controller on an integrated circuit that includes a processor on the integrated circuit which executes instructions received at an instruction input to the processor module. First and second memory arrays of non-volatile memory cells are provided on the integrated circuit. The first memory array stores the in-circuit programming set of instructions in a particular block of non-volatile cells. An external port is provided on the integrated circuit by which data is received from an external source. Control logic, including the processor and a kernel in the ICP code, is responsive to an in-circuit programming update command to write a copy of the in-circuit programming set from the first memory array to the second memory array, and to cause the in-circuit programming set from the second memory to program the non-volatile memory cells of the first memory array with data received from external port. Data paths on the integrated circuit are provided for programming and verifying the first memory array, independent of the in-circuit programming set. The external port comprises in alternative embodiments, a serial port and a parallel port. In yet another embodiment, there are a plurality of external ports on the device, and the one selected for use during the in-circuit programming sequence is specified by the in-circuit programming software itself.

Accordingly, a method for in-circuit programming of an integrated circuit having a processor which executes a program of instructions is provided. The method includes:

1. providing on the integrated circuit a first erasable and programmable read only memory array and a second erasable and programmable read only memory array;
2. storing an in-circuit programming set of instructions in the first array;
3. receiving an in-circuit program command from an initiator external to the integrated circuit;
4. in response to the in-circuit program command, copying the in-circuit programming set from the first array to the second array, and executing with the processor the in-circuit programming set from the second array;
5. programming at least a selected portion of the first array with data from an external source under control of the in-circuit programming set; and
6. after programming the portion of the first array, executing with the processor the in-circuit programming set from the first array.

According to another aspect of the present invention, the method includes storing the in-circuit programming set in the selected portion of the first memory array. Alternatively, the method can include the step of determining from the initiator whether the in-circuit programming sequence, indicated by the in-circuit programming command, includes modifying the in-circuit programming set. If the sequence does include the modification, then the step of copying and executing is carried out. If not, then the step of copying and executing is skipped, and the algorithm proceeds directly to programming the instructions and data in other portions of the memory array.

In sum, the present invention provides an in-circuit programming technique which allows for dynamic alternation of the in-circuit programming sequences of instructions. This enables the use of the device in a wide variety of environments, and in dynamically changing environments.

For example, if a communication protocol is updated, then the in-circuit programming sequence of instructions itself may need modification. According to the present invention, a microcontroller can be placed in the field and dynamically updated as communication protocols are improved or speeds are increased. Furthermore, the device can be adapted for a wide variety of communications ports, allowing more widespread application of the microcontroller with in-circuit programming capability.

Other aspects and advantages of the present invention can be seen upon review of the figures, the detailed description, and the claims that follow.

DETAILED DESCRIPTION

Figure 1:
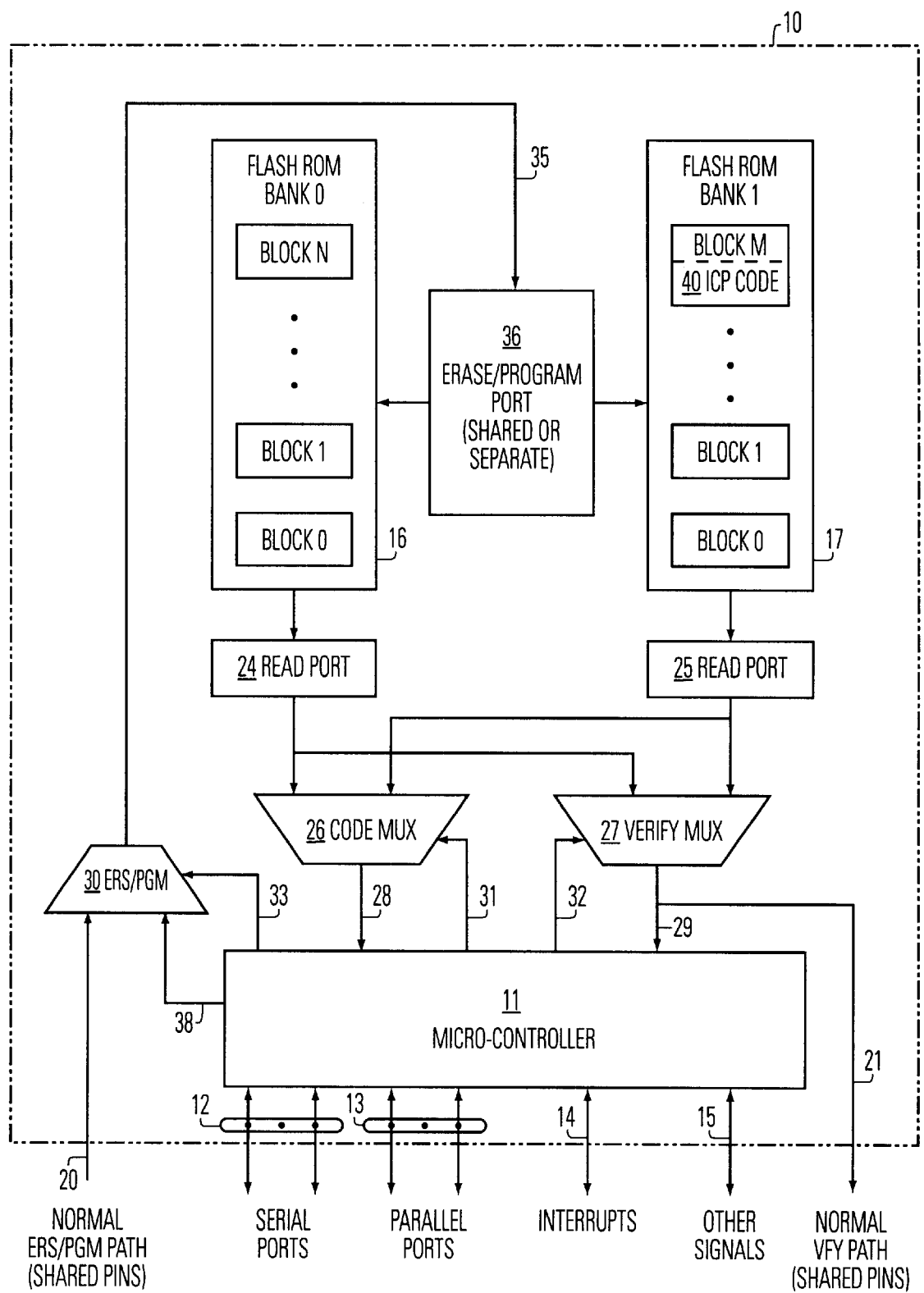
FIG. 1 is a schematic block diagram of an integrated circuit microcontroller, including the in-circuit programming structures of the present invention.

A detailed description of preferred embodiments of the present invention is provided with reference to FIGS. 1, 2A–2C, 3, and 4, in which FIG. 1 provides a hardware block diagram of the device.

FIG. 1 is a simplified diagram of an integrated circuit 10 having a processor, such as a microcontroller 11, embedded on the integrated circuit 10. Microcontroller 11 includes a plurality of serial ports 12, a plurality of parallel ports 13, interrupt pins 14, and other signal pins 15. For example, microcontroller 11 may be compatible with the standard 8051 microcontroller instruction set known in the art. A plurality of ports 12 and 13 are implemented on the device using standard interface technology. Alternative designs include special purpose ports on chip.

To support the in-circuit programming functionality of the present invention, a first array 16 of non-volatile memory and a second array 17 of non-volatile memory are embedded on integrated circuit 10. According to a preferred embodiment, first array 16 comprises flash ROM cells, which are implemented using floating gate memory cells, as known in the art. The first array includes a plurality of blocks of flash ROM cells, block O through block N, and is referred to as bank 0. Second array 17 also comprises flash ROM, and includes a plurality of blocks of cells, block O through block M and is referred to as bank 1.

The integrated circuit includes a normal path 20 for erase and programming of arrays 16 and 17 and a normal verify path 21 for verifying the erase and programming processes, as known in the art. In a preferred system, normal paths 20 and 21 are coupled to external circuits by I/O pins on integrated circuit 10. Furthermore, these I/O pins on integrated circuit 10 are multiplexed with other pins supporting ports 12, 13, interrupts 14, and other signals 15. Thus, for example, during a test mode or manufacturing mode, the normal erase and program path 20 and the normal verify path 21 are enabled, while other functions of the I/O chips are disabled. Techniques for accomplishing the multiplexed I/O pins are common in the art.

First array 16 and second array 17 include respective read ports 24 and 25, for providing instructions stored in the arrays to microcontroller 11. Thus, read port 24 is coupled to a code input multiplexer 26, and read port 25 is coupled to the code input multiplexer 26. In a similar fashion, both read ports 24 and 25 are coupled to a verify multiplexer 27 by which data in array 16 and array 17 is read during a verify procedure.

The output of the code multiplexer 26 is supplied to an instruction input 28 for microcontroller 11. The output of the verify multiplexer 27 is supplied to a read input 29 of microcontroller 11 and to normal verify path 21.

Normal erase/program path 20 is connected to an erase/program selector 30. A second input to selector 30 includes erase and program signals on line 38 from microcontroller 11. Microcontroller 11 controls multiplexer 26 and multiplexer 27 as indicated by lines 31 and 32. Also, microcontroller 11 controls selector 30, as indicated by line 33.

Erase/program selector 30 supplies the erase and program data and signals on line 35 to erase/program port 36 for first array 16 and second array 17. The erase/program port 36 includes logic and circuits used in the erase and program operation for the arrays, such as a control state machine, a high voltage generator, a negative voltage generator, timers and the like. In the preferred embodiment, a shared erase/program circuits are used for both first array 16 and second array 17. In an alternative, separate erase/program circuits are used for the separate non-volatile memory cells. The use of separate erase/program circuits may be preferred to simplify implementation of the device, at the cost of consuming chip area.

In the embodiment illustrated in FIG. 1, only two banks of flash ROM cells are illustrated. Alternative systems include more than two banks of flash ROM cells, allowing even greater flexibility in the design and implementation of in-circuit programming structures.

As illustrated in FIG. 1, memory arrays 16 and 17 store instructions which are executed by microcontroller 11. One portion of the instructions comprises an ICP kernel, referred to as an in-circuit programming set of instructions 40. The ICP kernel includes essential ICP code and/or system code that must be preserved during in-circuit programming processes. In the embodiment shown in FIG. 1, the in-circuit programming set is stored in block M of bank 1 of flash ROM array 17. In-circuit programming set 40 can be stored at any particular block in the device in any given implementation. Also, arrays 16 and 17 include a plurality of blocks of cells which are separately erasable, according to a segmented flash architecture, for example, such as that described in U.S. Pat. No. 5,526,307, entitled FLASH EPROM INTEGRATED CIRCUIT ARCHITECTURE, invented by Yin, et al. Alternative embodiments include a plurality of separately erasable blocks in first array 16, and a single block in second array 17. Alternatively, a single block may be stored in each array. A wide variety of combinations of memory architectures can be implemented as suits the needs of a particular system.

Using the architecture of FIG. 1, designers of systems are enabled to adapt the in-circuit programming code to their particular environment. Thus, a manufacturer selects an integrated circuit, shown in FIG. 1, for implementation in their circuit. If the in-circuit programming code is not ready, the microcontroller is utilized and the variety of communication ports available on the chip are taken advantage of the minimize the extra logic needed on the circuit board with the microcontroller, to match the system to the particular in-circuit programming (ICP) environment envisioned. The proper connection and protocol for in-circuit programming is selected by the designer. The ICP code for the selected environment is developed and improved. Next, the ICP code is integrated with programs to be executed during normal operation of the system. Using normal erase and program path 20, the integrated ICP code and user code are stored in the flash memory arrays 16 and 17. Next, using normal verify path 21, the erase and program operations are verified. The smart microcontroller, having the integrated ICP code is then placed inside the system. The ICP procedure is executed and tested. If the ICP code works, well, then the system is tested. If the system works well, then the system products can be mass produced. If the ICP code needs modification, then the process can be iteratively executed to optimize the ICP code. Similarly, the system code is optimized using the same techniques. The end user of the system developed by the manufacturer thus, has a robust in-circuit programming code embedded in the microcontroller, which can be updated and modified on the fly using the interactive in-circuit programming techniques, according to the present invention.

Figure 2A:
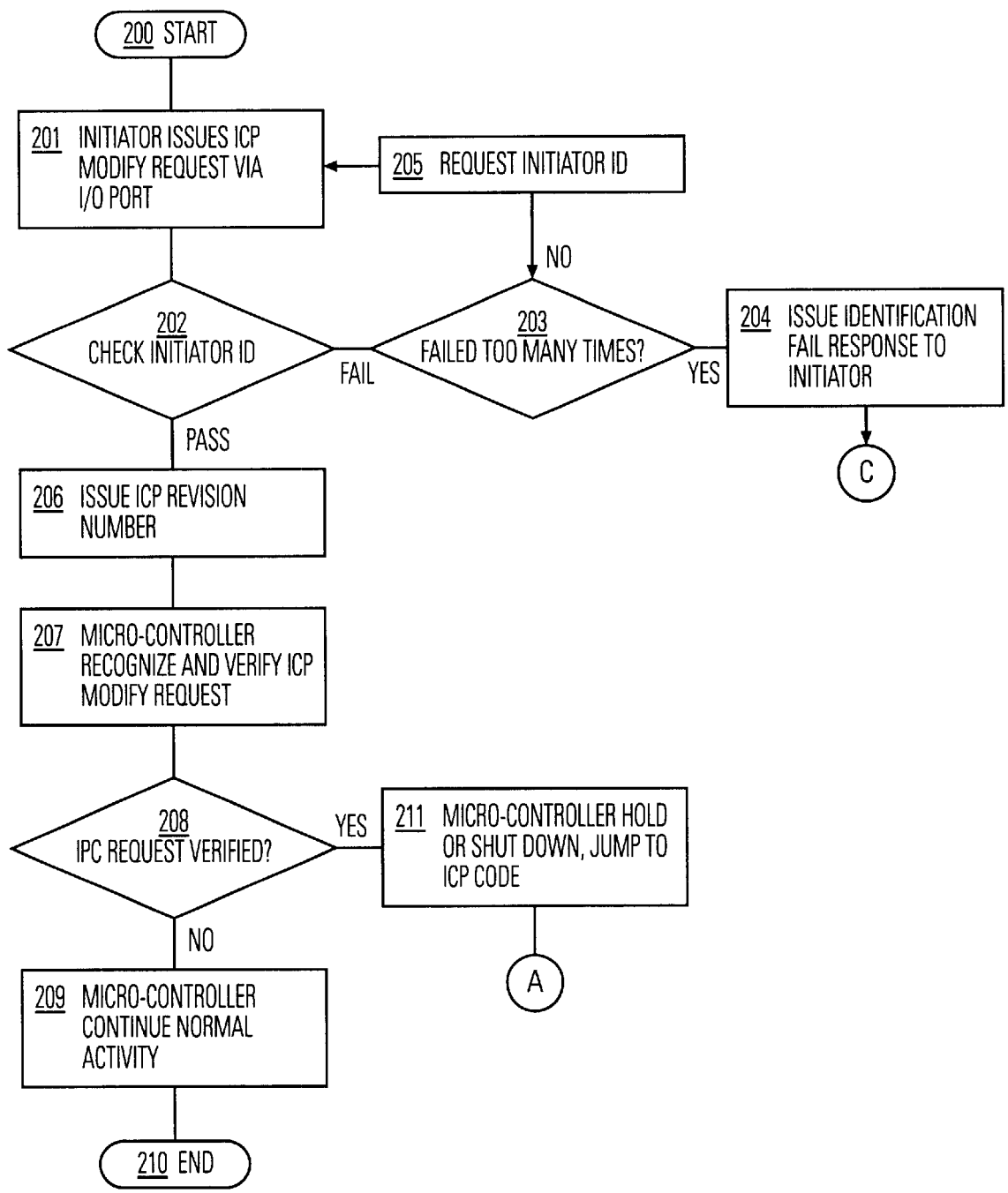
FIGS. 2A–2C are a flow chart of a preferred in-circuit programming process, according to the present invention.
Figure 2B:
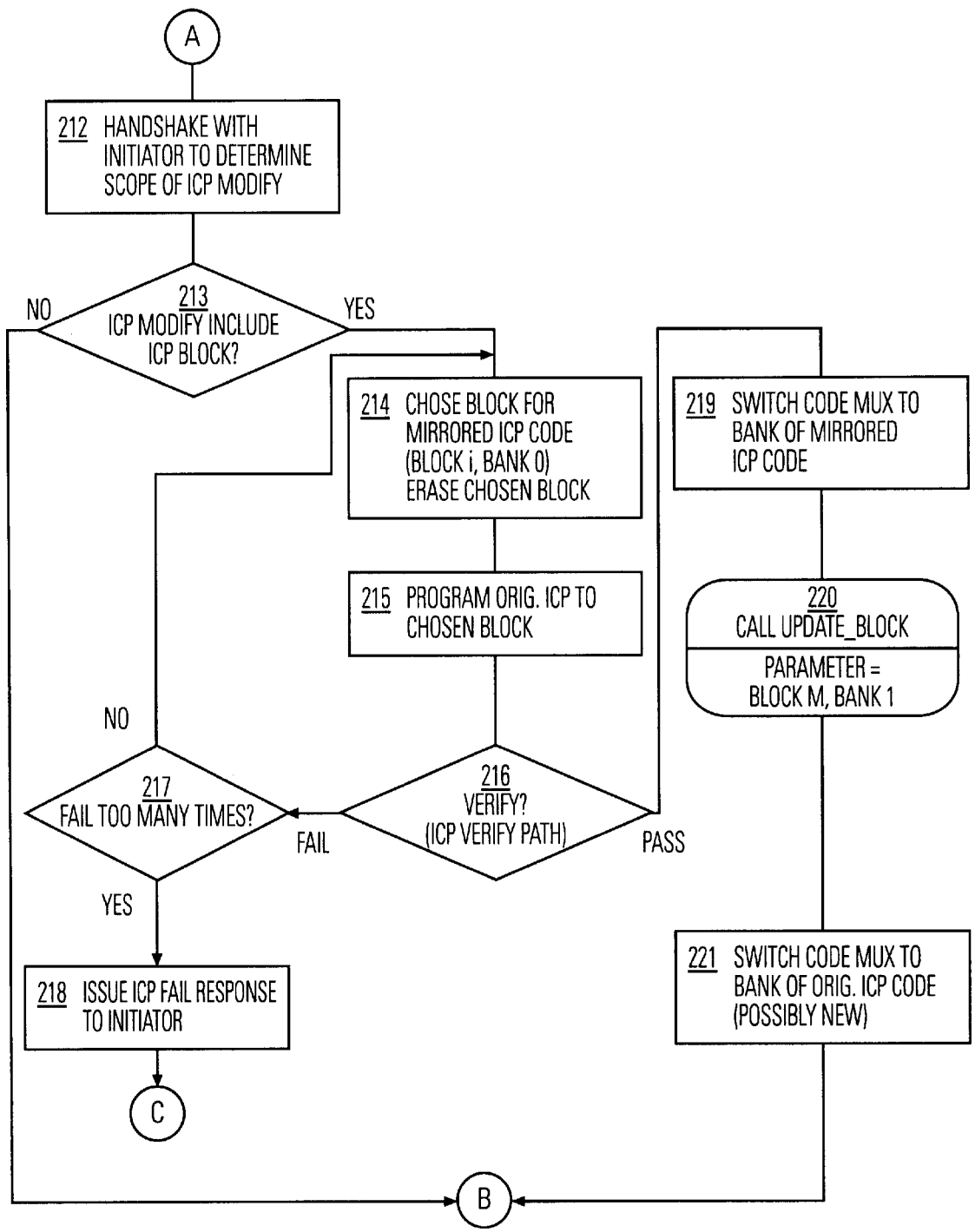
Figure 2C:
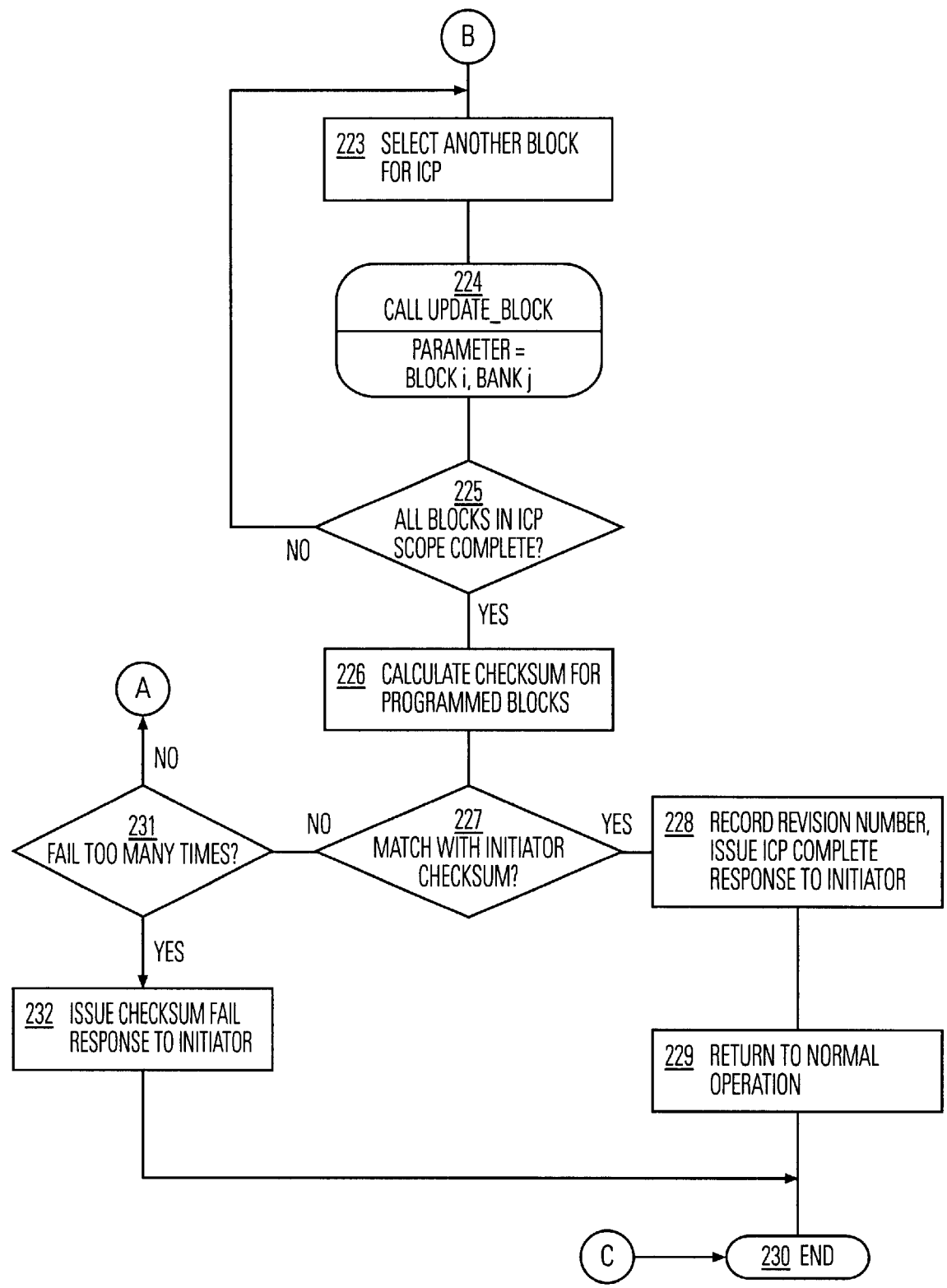

FIG. 2A–2C illustrate the in-circuit programming techniques executed by end users, according to the present invention. The logic, according to FIGS. 2A–2C, is implemented by software executed by the microcontroller, by dedicated logic circuits, or by a combination of software and dedicated logic circuits.

The process begin in FIG. 2A when a remote initiator desires to update or replace the in-circuit programming set of instructions or other software stored in one of the flash ROM banks of the integrated circuit, as indicated at point 200. A first step involves the initiator sending an ICP modify request via an I/O port on the integrated circuit (block 201). The microcontroller checks the identifier of the initiator, which is carried with the request. (block 202). If the identifier check fails, the algorithm determines whether a threshhold number of failures has occurred (block 203). If the test has failed too many times, then the microcontroller issues an identification fail response to the initiator (block 204), and branches to point C in FIG. 2C. If the test of block 202 has not failed too many times, then the microcontroller issues an initiator identifier request to the initiator (block 205), and branches to block 201. If the initiator identifier test of block 202 passes, the initiator or the microcontroller issues a revision number to identify the update (block 206). Next, the microcontroller recognizes and verifies the ICP modify request in the next step (block 207). For example, in one embodiment, the microcontroller issues an ICP identification command back to the ICP initiator. The initiator responds with an acknowledgment to open an ICP communication channel.

In the next step, the microcontroller determines whether the ICP modify request has been verified (block 208). If the request is not verified, then the microcontroller continues with normal activity (block 209) and the sequence ends (block 210). If the ICP modify request is verified, then the microcontroller executes a trap to the ICP code (block 211). Thus, the microcontroller holds its current status, shuts down normal activities, and jumps to the ICP code, to begin getting ready for an in-circuit programming sequence. The process continues to point A in FIG. 2B.

The first step in FIG. 2B involves a handshake protocol with the initiator to determine the scope of the ICP modify sequence (block 212). For example, the ICP modify sequence may involve one block or many blocks in the first and second arrays in the integrated circuit. Also, the handshake protocol determines whether the ICP code itself is subject of the modify operation. Thus, the next step determines whether the ICP block is included in the modify sequence (block 213). If the ICP block is not included in the modify sequence, then the algorithm proceeds to point B as indicated, which picks up in FIG. 2C. If the ICP modify sequence does include the ICP block, then the ICP logic chooses a block for storing mirrored ICP code (block i bank 0 in the embodiment where the ICP code is originally stored in bank 1). Upon choosing the block in which to mirror the ICP code, the chosen block is erased (block 214). Next, the original ICP code is programmed into the chosen block in bank 0 (block 215).

After the program sequence, a verify operation is executed (block 216). If the verify sequence fails, then the algorithm determines whether the program of the ICP block has failed too many times (block 217). If not, then the program of the ICP block is retried by looping to block 214. If the sequence has failed too many times, then the logic issues an ICP fail response to the initiator (block 218), and branches to point C in FIG. 2C.

Figure 3:
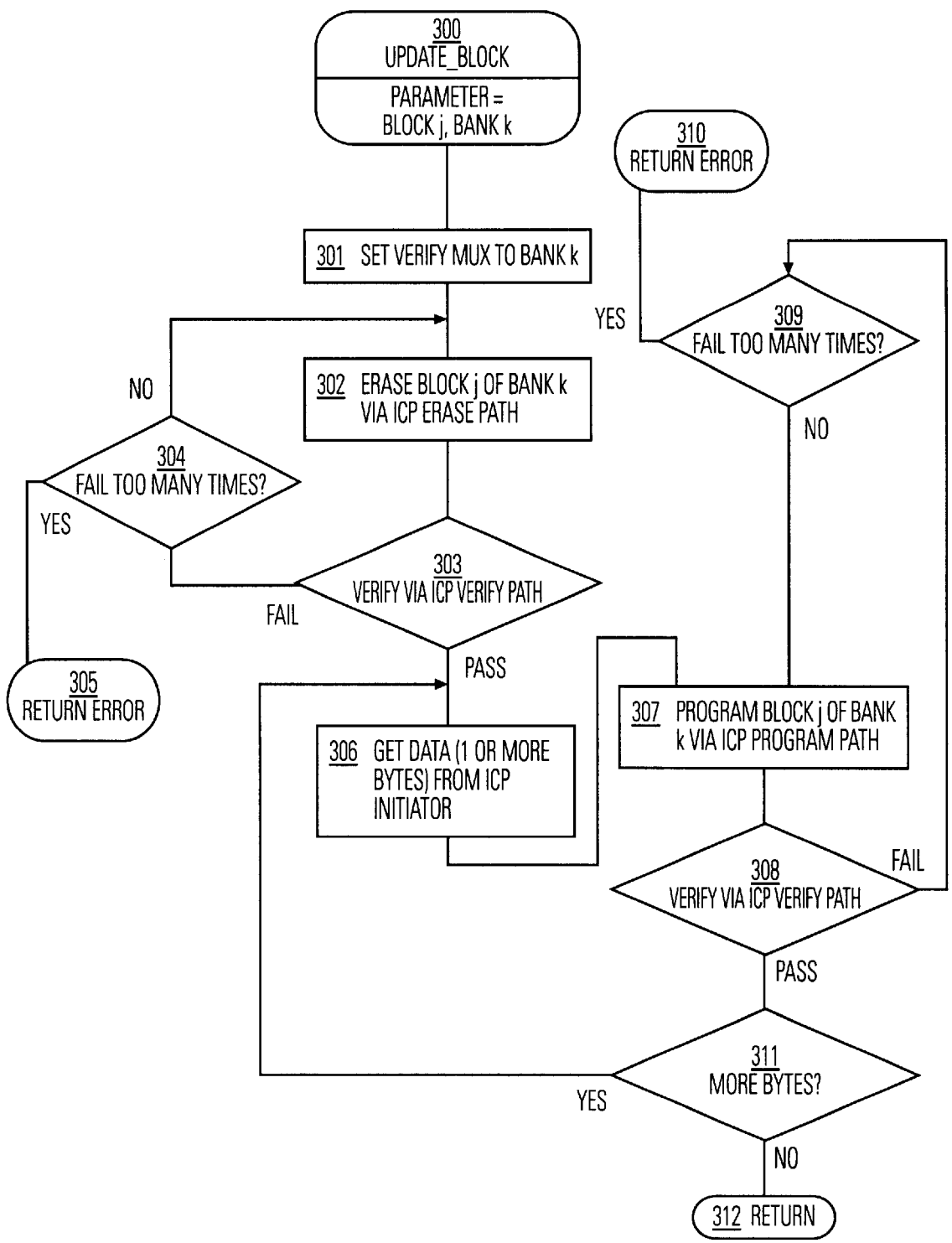
FIG. 3 is a flow chart of the update block routine which is called in the process of FIGS. 2A–2C.

If at block 216, the verify procedure passes, then the code multiplexer (e.g., multiplexer 26 of FIG. 1) is switched to select instructions from the bank in which the mirrored ICP code is stored (block 219). Mirrored ICP code is executed, and a call to the update block routine with the parameters set for block M of bank 1, is made (block 220). The update block routine is illustrated in FIG. 3, and results in updating block M of bank 1, with possibly new ICP code. After step 215, the code multiplexer is switched back to the original bank, bank 1, storing the possibly new ICP code (block 221). The algorithm then proceeds to point B of FIG. 2C.

In FIG. 2C, the next step involves selecting another block for the ICP procedure, if any (block 223). After selecting another block, the update block is called with a parameter set at block i, bank j, indicating the selected block (block 224). The algorithm next determines whether all blocks in the in-circuit programming sequence are completed (block 225). If yes, then a checksum is calculated for all programmed blocks (block 226). If no at block 225, then the algorithm loops to block 223. The loop continues until all blocks in the determined scope of the in-circuit programming procedure have been completed. After completion of the ICP procedure, a checksum is calculated for all programmed blocks (block 226). A protocol is initiated to match the calculated checksum with the checksum provided by the initiator (block 227). If a match occurs, then the microcontroller records the revision number, and issues an ICP complete response to the initiator (block 228). Then the microcontroller returns to normal operation (block 229), and the algorithm ends (block 230). If the checksum does not match at block 227, then the algorithm determines whether the ICP sequence has failed too many times (block 231). If it has not failed too many times, then the algorithm loops to point A of FIG. 2A, to retry the ICP sequence. If the ICP sequence has failed too many times, then the algorithm issues an ICP fail response to the initiator (block 232) and the procedure ends (block 230).

The update block procedure is illustrated in FIG. 3. Thus, the update block procedure is called with a parameter set, for instance block j, bank k (block 300). The sequence sets the verify multiplexer to select bank k for the verify path (block 301). Next block j of bank k is erased using the ICP erase path (block 302). After the erase process, a verify sequence is executed (block 303). If the verify fails, then it is determined whether the erase procedure has failed too many times (block 304). If not, then the algorithm loops back to block 302 to retry the erase. If it has failed too many times, then an error is returned (block 305). After successful verify from block 303, data is retrieved from the ICP initiator (block 306). The data from the ICP initiator may be one or more bytes of data depending on the ICP protocol selected by the user.

After retrieving the data from the ICP initiator, the algorithm programs block j of bank k via the ICP program path (block 307). After the program sequence, a verify operation is executed (block 308). If the program verify fails, then it is determined whether the fail has occurred too many times (block 309). If it has failed too many times, then an error is returned (block 310). If the verify has not failed too many times, then the program is retried by looping to block 307. If at block 308 the verify succeeds, then it is determined whether the ICP sequence includes more data for programming into block j of bank k (block 311). If yes, then the algorithm loops to block 306 to retrieve the next sequence of data for programming. If no more bytes remain, then the algorithm returns (block 312).

Figure 4:
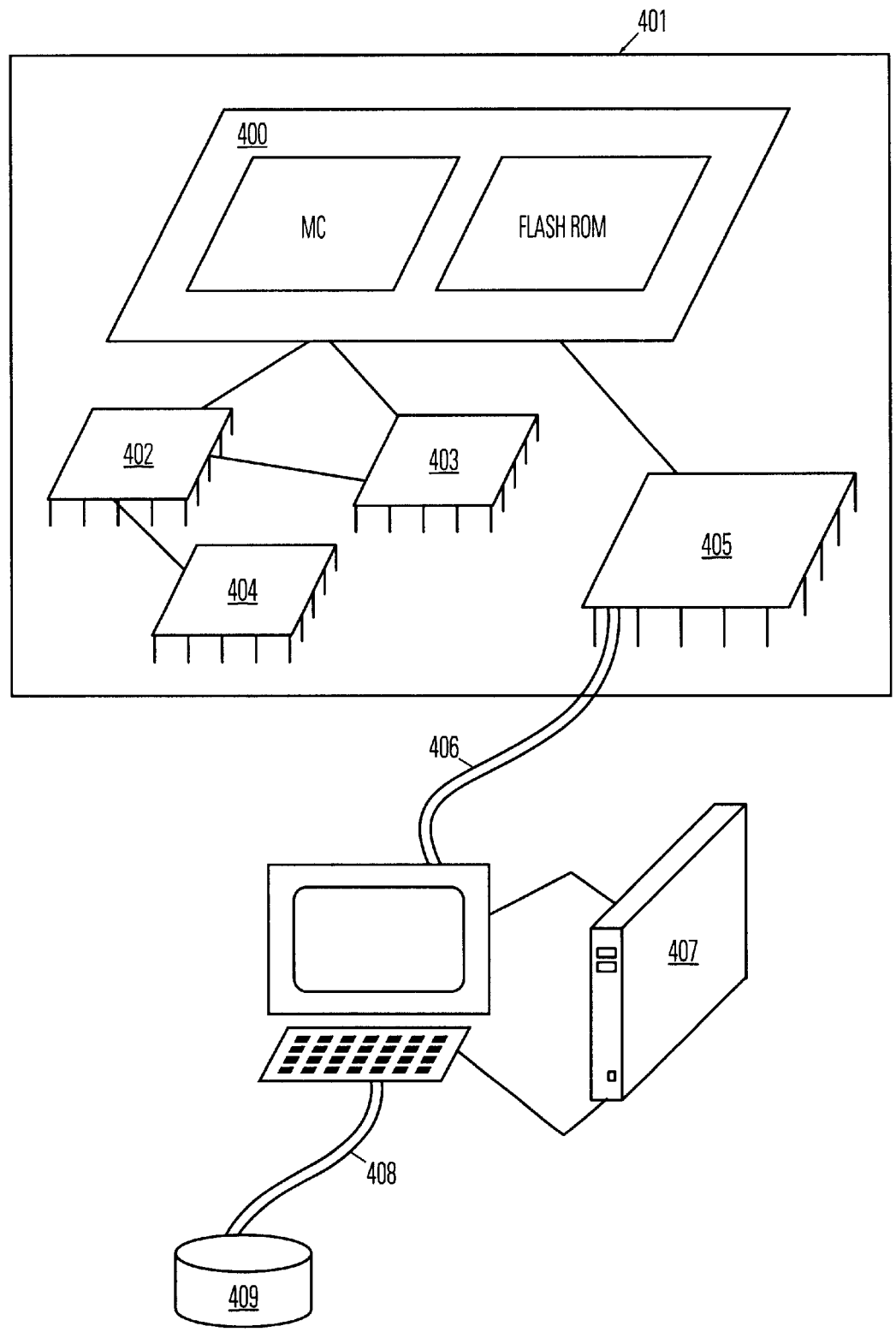
FIG. 4 illustrates an environment of application of the present invention.

FIG. 4 illustrates the environment of application of the present invention. The present invention is implemented on an integrated circuit 400 which is placed on a printed circuit board 401 or other system implementation. The microcontroller 400 is coupled to a plurality of integrated circuits 402, 403, 404, and/or 405, in the system in which it is utilized. Chip 405 provides a bridge to a communication channel across which ICP programming is achieved. Chip 405 may comprise a simple network port, or may include extra glue logic, to make the ICP solution transparent to existing system behavior. The character of port chip 405 will be different in different applications. Chip 405 may be coupled to diverse ICP communication channels having different levels of data rates, error rates, and complexity. For example, the communication channel 406, in one embodiment, comprises an Internet protocol. Channel 406 is coupled to an ICP initiator 407, such as a personal computer or workstation. Workstation 407 is coupled by a network or other communication channel 408 to a large scale storage 409. For example, workstation 407 may be a World Wide Web site accessed through the Internet on channel 406. Alternatively, in other systems, workstation 407 acts as the initiator across a dial-up modem link. In another alternative, communication link 406 is a communication bus in a personal computer, and the in-circuit software is loaded across the bus 406, so that the upgrades to system 401 can be distributed to end users on floppy disks or otherwise in loaded through personal computer 407.

Accordingly, the present invention provides a smart and flexible flash memory-based microcontroller architecture which allows for diverse in-circuit programming applications. For example, televisions or video monitors, digital video disks or CD-ROMs, remote control devices, or mobile telephones may include microcontrollers with in-circuit programming structures, according to the present invention. Various sources of updated ICP code can then be loaded into the respective devices using the flexible architecture of the present invention. The single in-circuit programming architecture of the present invention can be utilized in a wide variety of applications. Very little or no glue logic is needed in order to support the in-circuit programming structures. Furthermore, the power of the microcontroller associated with the in-circuit programming can be leveraged to increase the flexibility and to customized to ICP protocol for a given environment.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus for in-circuit programming of an integrated circuit comprising:

a processor on the integrated circuit which executes instructions;

an external port on the integrated circuit through which data is received from an external source;

a first memory array comprising reprogrammable non-volatile memory cells on the integrated circuit, which stores instructions for execution by the processor, including a set of instructions for controlling transfer of an in-circuit programming set of instructions into the integrated circuit from the external source through the external port; and a second memory array on the integrated circuit, and wherein the in-circuit programming set of instructions includes logic to:

write a copy of the original in-circuit programming set from the first memory array to the second memory array to create a mirrored in-circuit programming set;

control a code multiplexer to switch the processor control from the original in-circuit programming set to the mirrored in-circuit programming set in the second memory array; and update the in-circuit programming set in the first memory array under the control of the mirrored in-circuit programming set in the second memory array.

2. The apparatus of claim 1, wherein the non-volatile memory cells in the first memory array comprise floating gate memory cells.

3. The apparatus of claim 1, wherein the external port comprises a parallel port.

4. The apparatus of claim 1, wherein the external port comprises a parallel port.

5. An apparatus for in-circuit programming of an integrated circuit comprising:

a processor on the integrated circuit which executes instructions;

an external port on the integrated circuit through which data is received from an external source;

a first memory array comprising reprogrammable non-volatile memory cells on the integrated circuit, which stores instructions for execution by the processor, including a set of instructions for controlling the transfer of an in-circuit programming set of instructions into the integrated circuit from the external source through the external port; and a plurality of ports to external set data sources, and wherein the port in the plurality of ports used for the external port during execution of the in-circuit programming set is determined by the instructions in the in-circuit programming set.

6. An apparatus for in-circuit programming of an integrated circuit comprising:

a processor on the integrated circuit which executes instruction;

a first memory array comprising reprogrammable non-volatile memory cells on the integrated circuit, which stores instructions for execution by the processor, including a set of instructions for controlling the transfer of an in-circuit programming set of instructions into the integrated circuit from the external source through the external port; and a plurality of ports to external data sources, and wherein an in-circuit program update command is received at one of the plurality of ports, and the one of the plurality of ports is determined by an instruction or instructions in the in-circuit programming set.

* * * * *